United States Patent
Ko

(10) Patent No.: US 10,910,493 B2
(45) Date of Patent: Feb. 2, 2021

(54) SEMICONDUCTOR DEVICE AND METHOD OF MANUFACTURING THE SAME

(71) Applicant: DB HITEK CO., LTD., Seoul (KR)

(72) Inventor: Choul Joo Ko, Seongnam-si (KR)

(73) Assignee: DB HITEK CO., LTD., Seouk (KR)

( * ) Notice: Subject to any disclaimer, the term of this patent is extended or adjusted under 35 U.S.C. 154(b) by 0 days.

(21) Appl. No.: 16/255,118

(22) Filed: Jan. 23, 2019

(65) Prior Publication Data

US 2019/0229213 A1    Jul. 25, 2019

(30) Foreign Application Priority Data

Jan. 24, 2018 (KR) .................. 10-2018-0008940

(51) Int. Cl.
| | |
|---|---|
| *H01L 29/78* | (2006.01) |
| *H01L 29/66* | (2006.01) |
| *H01L 29/06* | (2006.01) |
| *H01L 29/423* | (2006.01) |
| *H01L 29/10* | (2006.01) |
| *H01L 29/08* | (2006.01) |

(52) U.S. Cl.
CPC ...... *H01L 29/7816* (2013.01); *H01L 29/0649* (2013.01); *H01L 29/1095* (2013.01); *H01L 29/42356* (2013.01); *H01L 29/66681* (2013.01); *H01L 29/66689* (2013.01); *H01L 29/0653* (2013.01); *H01L 29/086* (2013.01); *H01L 29/1083* (2013.01)

(58) Field of Classification Search
CPC ............. H01L 29/7816; H01L 29/0649; H01L 29/1095; H01L 29/42356; H01L 29/66681; H01L 29/66689; H01L 29/0653; H01L 29/086; H01L 29/1083; H01L 29/66674–66734; H01L 29/7801–7826; H01L 29/0856–0869

See application file for complete search history.

(56) References Cited

U.S. PATENT DOCUMENTS

| | | | |
|---|---|---|---|
| 6,211,552 B1 * | 4/2001 | Efland | H01L 29/7835 257/343 |
| 2010/0123195 A1 | 5/2010 | Lee | |
| 2011/0127607 A1 * | 6/2011 | Cai | H01L 29/7835 257/339 |
| 2015/0041894 A1 * | 2/2015 | Hebert | H01L 29/0634 257/339 |

(Continued)

*Primary Examiner* — Shahed Ahmed
(74) *Attorney, Agent, or Firm* — Patterson Thuente Pedersen, P.A.

(57) ABSTRACT

A semiconductor device and a method of manufacturing the same are disclosed. The semiconductor device includes a first body region disposed in a substrate and having a first conductivity type, a second body region disposed on the first body region and having the first conductivity type and a portion protruding in a channel length direction, a source region disposed in the second body region and having a second conductivity type, a drain region spaced apart from the protruding portion of the second body region in the channel length direction and having the second conductivity type, a well region configured to electrically connect the protruding portion of the second body region and the drain region and having the second conductivity type, and a gate structure disposed on the protruding portion of the second body region.

17 Claims, 7 Drawing Sheets

(56) References Cited

U.S. PATENT DOCUMENTS

| | | | |
|---|---|---|---|
| 2016/0064553 A1* | 3/2016 | Furuhata | H01L 29/66681 |
| | | | 257/336 |
| 2016/0336308 A1* | 11/2016 | Esmark | H01L 29/7816 |
| 2017/0162690 A1* | 6/2017 | Edwards | H01L 29/0696 |
| 2018/0212053 A1* | 7/2018 | Fang | H01L 29/7816 |
| 2018/0277531 A1* | 9/2018 | Takeuchi | H01L 29/7816 |

* cited by examiner

SEMICONDUCTOR DEVICE AND METHOD OF MANUFACTURING THE SAME

CROSS-REFERENCE TO RELATED APPLICATION

This application claims the priority benefit of Korean Patent Application No. 10-2018-0008940, filed on Jan. 24, 2018, and all the benefits accruing therefrom under 35 U.S.C. § 119, the contents of which are incorporated by reference in their entirety.

TECHNICAL FIELD

The present disclosure relates generally to the field of semiconductor devices with increased ON-state breakdown voltage.

BACKGROUND

The present disclosure relates to a semiconductor device and a method of manufacturing the same. More specifically, the present disclosure relates to a high voltage semiconductor device such as a laterally double diffused metal oxide semiconductor (LDMOS) device and a method of manufacturing the same.

A semiconductor device such as an LDMOS device may include a source region formed in body region and a drain region formed in a drift region. Further, the semiconductor device may include a field plate made of an insulating material to improve the drain-source breakdown voltage, and an impurity concentration of the body region may be increased to improve the on-state breakdown voltage.

The body region may be formed by an ion implantation process after forming a gate electrode. Particularly, the body region may be formed using impurity ions having a relatively high energy. However, some impurity ions may be implanted into a surface portion of a substrate through the gate electrode during the ion implantation process. The surface portion of the substrate under the gate electrode may be used as a channel region of the semiconductor device, and thus it may be very difficult to adjust the threshold voltage of the semiconductor device to a desired level by the impurity ions implanted into the surface portion of the substrate under the gate electrode.

Further, when the impurity concentration of the body region is reduced to adjust the threshold voltage of the semiconductor device, the on-state breakdown voltage of the semiconductor device may be reduced.

SUMMARY

The present disclosure provides a semiconductor device capable of easily adjusting the threshold voltage and improving the breakdown voltage and a method of manufacturing the same.

In accordance with an aspect of the present disclosure, a semiconductor device may include a first body region disposed in a substrate and having a first conductivity type, a second body region disposed on the first body region and having the first conductivity type and a portion protruding in a channel length direction, a source region disposed in the second body region and having a second conductivity type, a drain region spaced apart from the protruding portion of the second body region in the channel length direction and having the second conductivity type, a well region configured to electrically connect the protruding portion of the second body region and the drain region and having the second conductivity type, and a gate structure disposed on the protruding portion of the second body region.

In accordance with some exemplary embodiments of the present disclosure, the first body region may have an impurity concentration higher than the protruding portion of the second body region.

In accordance with some exemplary embodiments of the present disclosure, the semiconductor device may further include a low concentration impurity region disposed in the protruding portion of the second body region and connected with the source region.

In accordance with some exemplary embodiments of the present disclosure, the first body region, the second body region and the drain region may be disposed in the well region.

In accordance with some exemplary embodiments of the present disclosure, the semiconductor device may further include a buried layer disposed in the substrate and having the second conductivity type. At this time, the well region may be disposed on the buried layer.

In accordance with some exemplary embodiments of the present disclosure, the buried layer may have an impurity concentration higher than the well region.

In accordance with some exemplary embodiments of the present disclosure, the semiconductor device may further include a field plate disposed between the protruding portion of the second body region and the drain region. The field plate may be made of an insulating material, and a portion of the gate structure may be disposed on a portion of the field plate.

In accordance with another aspect of the present disclosure, a semiconductor device may include a body region disposed in a substrate and having a first conductivity type, a channel region disposed on one side of the body region and having the first conductivity type and an impurity concentration lower than the body region, a source region disposed in the body region and having a second conductivity type, a drain region spaced apart from the channel region in a channel length direction and having the second conductivity type, a well region configured to electrically connect the channel region and the drain region and having the second conductivity type, and a gate structure disposed on the channel region.

In accordance with some exemplary embodiments of the present disclosure, the semiconductor device may further include a field plate disposed between the channel region and the drain region and made of an insulating material.

In accordance with some exemplary embodiments of the present disclosure, the semiconductor device may further include a buried layer disposed in the substrate and having the second conductivity type and an impurity concentration higher than the well region. At this time, the well region may be disposed on the buried layer, and the body region, the channel region and the drain region may be disposed in the well region.

In accordance with still another aspect of the present disclosure, a method of manufacturing a semiconductor device may include forming a well region having a second conductivity type in a substrate, forming a first body region having a first conductivity type in the well region, forming a second body region on the first body region, the second body region having the first conductivity type and a portion protruding in a channel length direction, forming a gate structure on the protruding portion of the second body region, forming a source region having the second conductivity type in the second body region, and forming a drain region in the well region, the drain region having the second conductivity type and being spaced apart from the protruding portion of the second body region in the channel length direction.

In accordance with some exemplary embodiments of the present disclosure, forming the first body region may include forming an insulating layer on the substrate, forming a conductive layer on the insulating layer, forming a bottom anti-reflection coating layer on the conductive layer, forming a photoresist pattern on the bottom anti-reflection coating layer, and performing an ion implantation process using the photoresist pattern as an ion implantation mask to form the first body region.

In accordance with some exemplary embodiments of the present disclosure, forming the second body region may include performing an etching process using the photoresist pattern as an etching mask to partially removing the bottom anti-reflection coating layer and the conductive layer and to form a bottom anti-reflection coating layer pattern and a conductive layer pattern, and performing a second ion implantation process using the photoresist pattern, the bottom anti-reflection coating layer pattern and the conductive layer pattern as a second ion implantation mask to form the second body region. At this time, the bottom anti-reflection coating layer pattern and the conductive layer pattern may be spaced apart from the first body region in the channel length direction by the etching process.

In accordance with some exemplary embodiments of the present disclosure, the method may further include performing a third ion implantation process using the photoresist pattern, the bottom anti-reflection coating layer pattern and the conductive layer pattern as a third ion implantation mask to form a low concentration impurity region having the second conductivity type in the second body region.

In accordance with some exemplary embodiments of the present disclosure, forming the gate structure include patterning the conductive layer pattern to form a gate electrode, and forming a gate spacer on side surfaces of the gate electrode.

In accordance with some exemplary embodiments of the present disclosure, the first body region may have an impurity concentration higher than the protruding portion of the second body region.

In accordance with some exemplary embodiments of the present disclosure, the method may further include forming a buried layer in the substrate. The buried layer may have the second conductivity type, and the well region may be disposed on the buried layer.

In accordance with some exemplary embodiments of the present disclosure, the buried layer may have an impurity concentration higher than the well region.

In accordance with some exemplary embodiments of the present disclosure, the method may further include forming a field plate made of an insulating material in the well region. The field plate may be disposed between the protruding portion of the second body region and the drain region, and a portion of the gate structure may be disposed on a portion of the field plate.

In accordance with some exemplary embodiments of the present disclosure, the method may further include forming a body contact region in the second body region.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
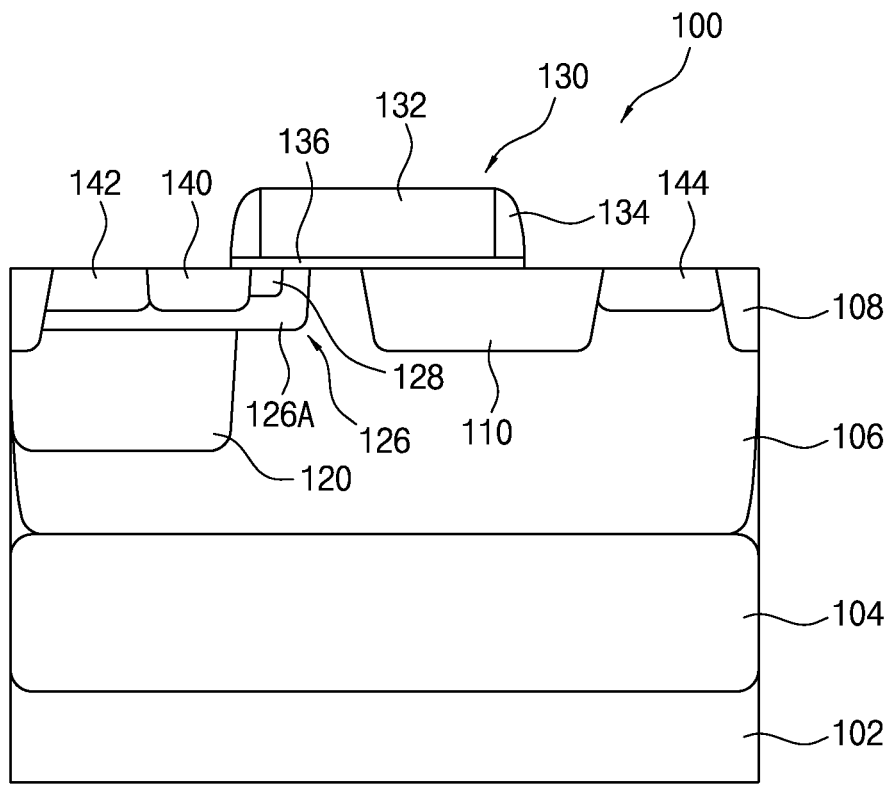
FIG. 1 is a schematic cross-sectional view illustrating a semiconductor device in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a schematic cross-sectional view illustrating a semiconductor device in accordance with an embodiment of the present disclosure.

Referring to FIG. 1, a semiconductor device 100, in accordance with an embodiment of the present disclosure, may include a first body region 120 disposed in a substrate 102, a second body region 126 disposed on the first body region 120 and having a protruding portion 126A in a channel length direction, a source region 140 disposed in the second body region 126, a drain region 144 spaced apart from the protruding portion 126A of the second body region 126 in the channel length direction, a well region 106 configured to selectively electrically connect the protruding portion 126A of the second body region 126 and the drain region 144, and a gate structure 130 disposed on the protruding portion 126A of the second body region 126 to cause the selective electrical interconnection.

The substrate 102 may have a first conductivity type. For example, a p-type substrate may be used as the substrate 102.

The first body region 120 may also have the first conductivity type. For example, the first body region 120 may be a p-type impurity region. The second body region 126 may have the first conductivity type and may include a second portion 126B (refer to FIG. 5) disposed on the first body region 120. That is, the protruding portion 126A may protrude from the second portion 126B in the channel length direction. Particularly, the first body region 120 may have an impurity concentration higher than the protruding portion 126A of the second body region 126. Further, the second portion 126B of the second body region 126 may have an impurity concentration higher than the first body region 120. Throughout this disclosure "high" and "low" conductivity are used as relative terms to describe the quantity of dopant in a particular structure, and should not be construed as limited to particular ranges of resistivity or doping.

The source region 140 may have a second conductivity type. For example, the source region 140 may be a high concentration n-type impurity region. Further, a low concentration impurity region 128 having the second conductivity type and an impurity concentration lower than the source region 140 may be disposed on one side of the source region 140, and a body contact region 142 having the first conductivity type may be disposed on another side of the source region 140. The lower concentration impurity region 128 may be disposed in the protruding portion 126A of the second body region 126. Particularly, the first body region 120 and the second portion 126B of the second body region 126 may be used as a body region of the semiconductor device 100, and the protruding portion 126A of the second body region 126 may be used as a channel region of the semiconductor device 100.

The drain region 144 may have the second conductivity type. In the example described above in which first body region 120 has p-type conductivity, therefore, the drain region 144 may be a high concentration n-type impurity region. The well region 106 may have the second conductivity type and an impurity concentration lower than the drain region 144. For example, the n-type well region 106 may be formed in the substrate 102, and the first body region 120, the second body region 126 and the drain region 144 may be formed in the n-type well region 106.

Further, the semiconductor device 100 may include a buried layer 104 disposed in the substrate 102. The buried layer 104 may have the second conductivity type and an impurity concentration higher than the well region 106. For example, the semiconductor device 100 may include an n-type buried layer 104, and the n-type well region 106 may be formed on the n-type buried layer 104. The n-type buried layer 104 may reduce a width of a depletion region between the first body region 120 and the n-type well region 106 thereby improving the punch-through voltage of the semiconductor device 100.

The semiconductor device 100 may include a field plate 110 to improve the drain-source breakdown voltage. The field plate 110 may be made of an insulating material, e.g., silicon oxide, and may be disposed between the protruding portion 126A of the second body region 126 and the drain region 144. Particularly, a portion of the gate structure 130 may be disposed on a portion of the field plate 110, and the drain region 144 may be disposed on one side of the field plate 110 so as to be spaced apart from the gate structure 130.

The gate structure 130 may include a gate electrode 132, a gate spacer 134 disposed on side surfaces of the gate electrode 132, and a gate insulating layer 136 disposed between the gate electrode 132 and the substrate 102. The gate electrode 132 may have the second conductivity type. For example, the gate electrode 132 may be made of polysilicon doped with an n-type impurity.

As described above, the first body region 120 and the second portion 126B of the second body region 126 functioning as the body region may have a relatively high impurity concentration, and thus the operation of a parasitic NPN bipolar junction transistor formed by the well region 106, the body region 120 and 126B, and the source region 140 may be suppressed, thereby improving the on-state breakdown voltage. Further, the first body region 120 may be relatively more spaced apart from the gate electrode 132 as compared to the prior art, and thus the drain-source breakdown voltage may be sufficiently improved.

FIGS. 2 to 8 are schematic cross-sectional views illustrating a method of manufacturing the semiconductor device as shown in FIG. 1.

Figure 2:
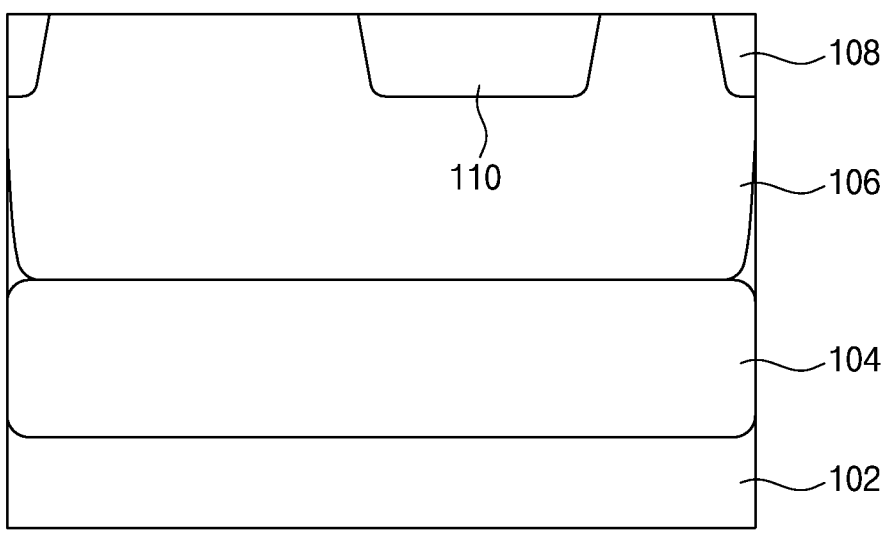
FIGS. 2 to 8 are schematic cross-sectional views illustrating a method of manufacturing the semiconductor device as shown in FIG. 1.

Referring to FIG. 2, a buried layer 104 having a second conductivity type may be formed in a substrate 102 having a first conductivity type. For example, a p-type silicon wafer may be used as the substrate 102, and an n-type buried layer 104 may be formed in the substrate 102 by an ion implantation process. Then, a well region 106 having the second conductivity type may be formed on the buried layer 104 by an ion implantation process. Particularly, the buried layer 104 may have an impurity concentration higher than the well region 106 to improve the punch-through voltage of the semiconductor device 100.

Further, a field plate 110 made of an insulating material, e.g., silicon oxide, may be formed in a surface portion of the substrate 102. Particularly, the field plate 110 may be used to improve the drain-source breakdown voltage of the semiconductor device 100, and may be formed in the well region 106 by a shallow trench isolation (STI) process before or after forming the well region 106. Further, device isolation regions 108 may be simultaneously formed with the field plate 110 to electrically isolate the semiconductor device from neighboring devices (not shown).

Figure 3:
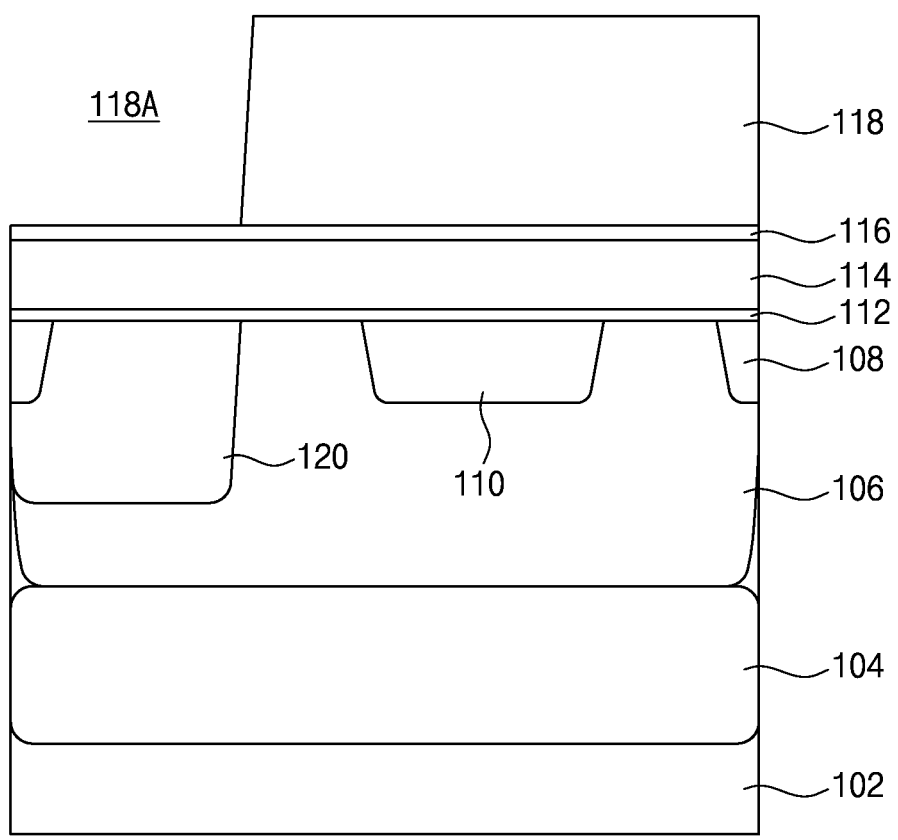

Referring to FIG. 3, an insulating layer 112 and a conductive layer 114 may be formed on the substrate 102. For example, a silicon oxide layer 112 may be formed on the substrate 102 by a thermal oxidation process, and an impurity doped polysilicon layer 114 may be formed on the silicon oxide layer 112 by a chemical vapor deposition (CVD) process.

A bottom anti-reflection coating (BARC) layer 116 may be formed on the conductive layer 114, and a first photoresist pattern 118 may be formed on the BARC layer 116. The first photoresist pattern 118 may have an opening 118A corresponding to a portion of the substrate 102 in which a first body region 120 is to be formed.

Then, an ion implantation process using the photoresist pattern 118 as an ion implantation mask may be performed in order to form a first body region 120 having the first conductivity type in the well region 106. For example, a p-type impurity region having a relatively high impurity concentration may be formed as the first body region 120 in the well region 106.

Figure 4:
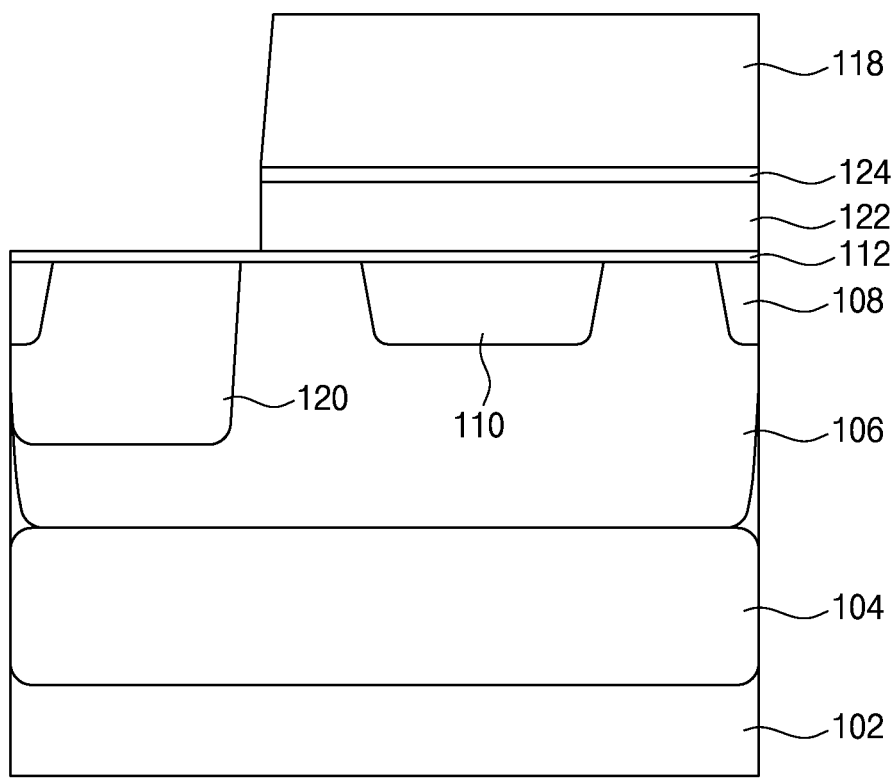

Referring to FIG. 4, an etching process using the photoresist pattern 118 as an etching mask may be anisotropically performed to partially remove the BARC layer 116 and the conductive layer 114, thereby forming a conductive layer pattern 122 and a BARC layer pattern 124 on the insulating layer 112. Particularly, the photoresist pattern 118 may be partially removed during the etching process, and thus the conductive layer pattern 122 and the BARC layer pattern 124 may be spaced apart from the first body region 120 in a channel length direction.

Figure 5:
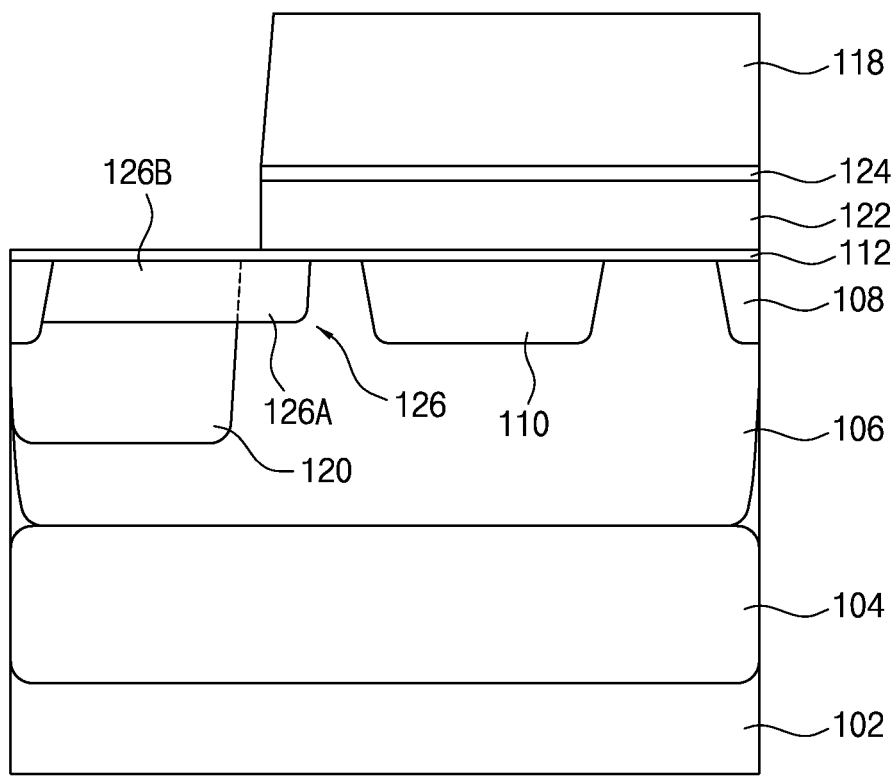

Referring to FIG. 5, an ion implantation process using the photoresist pattern 118, the BARC layer pattern 124 and the conductive layer pattern 122 as an ion implantation mask may be performed to form a second body region 126 having the first conductivity type on the first body region 120. For example, the second body region 126 may be formed using p-type impurity ions having a relatively low energy as compared to the first body region 120.

Particularly, because the conductive layer pattern 122 and the BARC layer pattern 124 are spaced apart from the first body region 120 in the channel length direction, a portion 126A of the second body region 126 may protrude in the channel length direction. Further, the p-type impurity ions may be diffused in the channel length direction, and thus the protruding portion 126A of the second body region 126 may be positioned under a portion of the conductive layer pattern 122.

Meanwhile, because the p-type impurity ions have a relatively low energy as described above, it is difficult to penetrate the conductive layer pattern 122. As a result, the p-type impurity ions cannot be implanted into a surface portion of the substrate 102 under the conductive layer pattern 122, and thus it becomes very easy to adjust an impurity concentration of the protruding portion 126A of the second body region 126. Further, the protruding portion 126A of the second body region 126 may be used as a channel region of the semiconductor device 100, and thus it becomes very easy to adjust the threshold voltage of the semiconductor device 100.

The protruding portion 126A of the second body region 126 may have an impurity concentration lower than the first body region 120. A second portion 126B of the second body region 126 may overlap an upper portion of the first body region 120, and thus may have an impurity concentration higher than the first body region 120. That is, the second portion 126B of the second body region 126 may be formed in the upper portion of the first body region 120.

Figure 6:
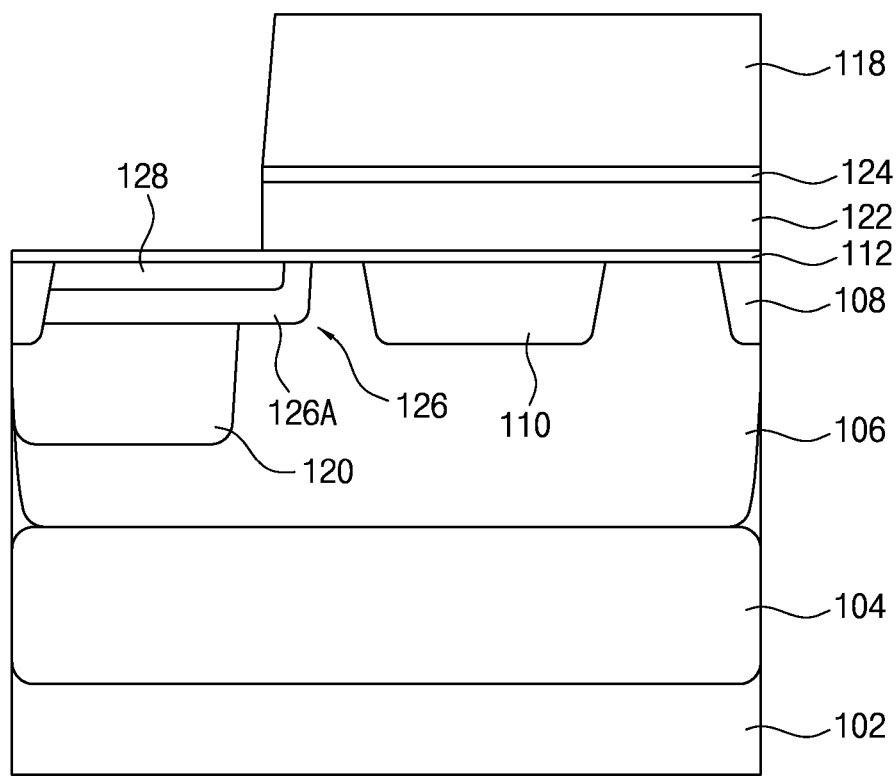

Referring to FIG. 6, an ion implantation process using the photoresist pattern 118, the BARC layer pattern 124 and the conductive layer pattern 122 as an ion implantation mask may be performed to form a low concentration impurity region 128 in the second body region 126. The low concentration impurity region 128 may have the second conductivity type. For example, the low concentration impurity region 128 may be formed by implanting n-type impurity ions into a surface portion of the second body region 126. Particularly, the n-type impurity ions may be diffused in the channel length direction, and thus a portion of the low concentration impurity region 128 may be positioned in the protruding portion 126A of the second body region 126.

The first photoresist pattern 118 and the BARC layer pattern 124 may be removed by an ashing or strip process after forming the low concentration impurity region 128.

Figure 7:
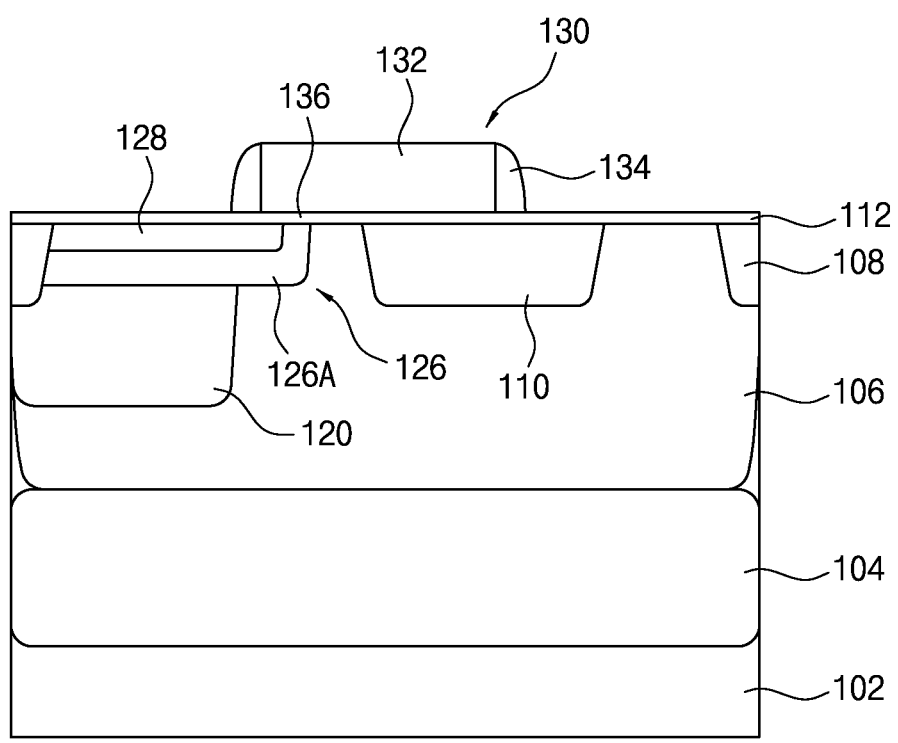

Referring to FIG. 7, a gate structure 130 may be formed on the substrate 102. Particularly, the gate structure 130 may be formed on the protruding portion 126A of the second body region 126. In detail, a gate electrode 132 may be formed on the insulating layer 112 by patterning the conductive layer pattern 122. For example, a second photoresist pattern (not shown) may be formed on the conductive layer pattern 122, and the gate electrode 132 may be formed by an etching process using the second photoresist pattern as an etching mask. Particularly, a portion of the gate electrode 132 may be disposed on a portion of the field plate 110.

Further, a gate spacer 134 may be formed on side surfaces of the gate electrode 132. For example, a second insulating layer (not shown) made of silicon oxide or silicon nitride may be formed on the gate electrode 132 and the insulating layer 112, and the gate spacer 134 may be formed by anisotropically etching the second insulating layer. At this time, a portion 136 of the insulating layer 112 between the gate electrode 132 and the substrate 102 may be used as a gate insulating layer.

Figure 8:
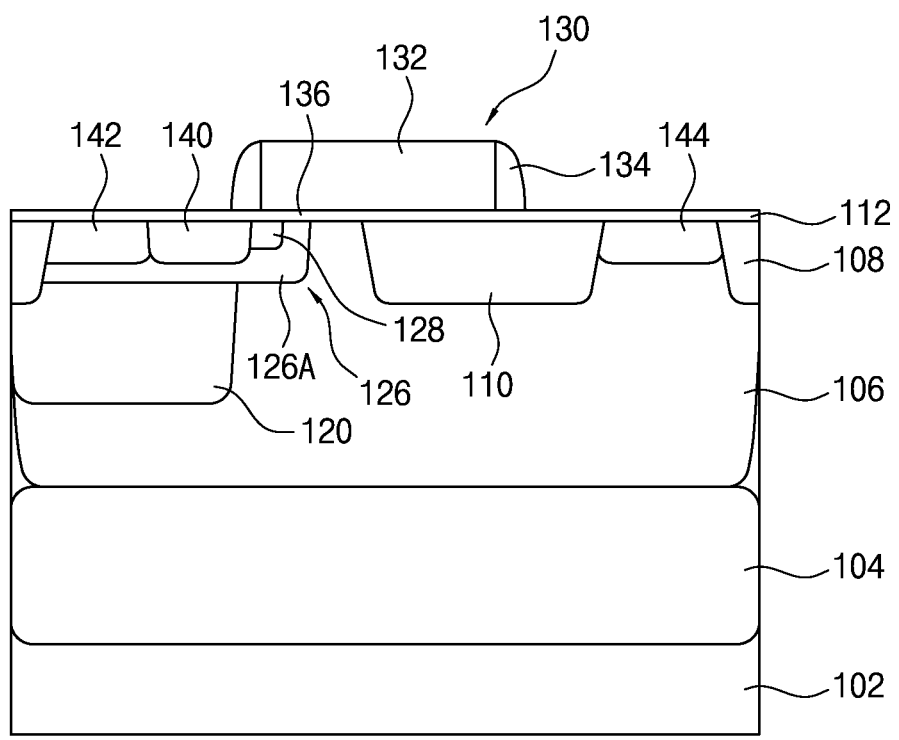

Referring to FIG. 8, a source region 140 having the second conductivity type may be formed in a surface portion of the second body region 126, and a body contact region 142 having the first conductivity type may be formed in a surface portion of the second body region 126 adjacent to the source region 140. Further, the source region 140 may be a high concentration n-type impurity region formed by an ion implantation process, and the body contact region 142 may be a high concentration p-type impurity region formed by an ion implantation process.

Further, a drain region 144 having the second conductivity type may be formed in a surface portion of the well region 106. The drain region 144 may be disposed on one side of the field plate 110 to be spaced apart from the gate structure 130. For example, the drain region 144 may be a high concentration n-type impurity region formed by an ion implantation process and may be simultaneously formed with the source region 140.

Alternatively, the drain region 144 may be formed after forming the field plate 110. Further, the remaining portions of the insulating layer 112 except the portion 136 between the gate electrode 132 and the substrate 102 may be removed by an etching process after forming the source region 140, the body contact region 142 and the drain region 144. The portion 136 of the insulating layer 112 between the gate electrode 132 and the substrate 102 may function as the gate insulating layer.

Although the semiconductor device 100 and the method of manufacturing the semiconductor device 100 have been described with reference to specific embodiments, they are not limited thereto. Therefore, it will be readily understood by those skilled in the art that various modifications and changes can be made thereto without departing from the spirit and scope of the present disclosure defined by the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A semiconductor device comprising:
    a first body region disposed in a substrate and having a first conductivity type;
    a second body region disposed on the first body region and having the first conductivity type, the second body region including a protruding portion that extends in a channel length direction from the first body region;
    a source region disposed in the second body region and having a second conductivity type opposite of the first conductivity type;
    a drain region spaced apart from the protruding portion of the second body region in the channel length direction and having the second conductivity type;
    a well region configured to electrically connect the protruding portion of the second body region and the drain region and having the second conductivity type; and
    a gate structure disposed on the protruding portion of the second body region.

2. The semiconductor device of claim 1, wherein the first body region has an impurity concentration higher than the protruding portion of the second body region.

3. The semiconductor device of claim 1, further comprising a low concentration impurity region disposed in the protruding portion of the second body region and connected with the source region.

4. The semiconductor device of claim 1, wherein the first body region, the second body region and the drain region are disposed in the well region.

5. The semiconductor device of claim 1, further comprising a buried layer disposed in the substrate and having the second conductivity type,
    wherein the well region is disposed on the buried layer.

6. The semiconductor device of claim 5, wherein the buried layer has an impurity concentration higher than the well region.

7. The semiconductor device of claim 1, further comprising a field plate disposed between the protruding portion of the second body region and the drain region and made of an insulating material,
    wherein a portion of the gate structure is disposed on a portion of the field plate.

8. A method of manufacturing a semiconductor device, the method comprising:
    forming a well region having a second conductivity type in a substrate;
    forming a first body region having a first conductivity type in the well region;
    forming a second body region on the first body region, the second body region having the first conductivity type and a portion protruding in a channel length direction from the first body region;
    forming a gate structure on the protruding portion of the second body region;
    forming a source region having the second conductivity type in the second body region; and
    forming a drain region in the well region, the drain region having the second conductivity type and being spaced apart from the protruding portion of the second body region in the channel length direction such that the well region is electrically connected to the protruding portion and the drain region.

9. The method of claim 8, wherein forming the first body region comprises:
    forming an insulating layer on the substrate;
    forming a conductive layer on the insulating layer;
    forming a bottom anti-reflection coating layer on the conductive layer;
    forming a photoresist pattern on the bottom anti-reflection coating layer; and
    performing an ion implantation process using the photoresist pattern as an ion implantation mask to form the first body region.

10. The method of claim 9, wherein forming the second body region comprises:
    performing an etching process using the photoresist pattern as an etching mask to partially removing the bottom anti-reflection coating layer and the conductive layer and to form a bottom anti-reflection coating layer pattern and a conductive layer pattern; and
    performing a second ion implantation process using the photoresist pattern, the bottom anti-reflection coating layer pattern and the conductive layer pattern as a second ion implantation mask to form the second body region,
    wherein the bottom anti-reflection coating layer pattern and the conductive layer pattern are spaced apart from the first body region in the channel length direction by the etching process.

11. The method of claim 10, further comprising performing a third ion implantation process using the photoresist pattern, the bottom anti-reflection coating layer pattern and the conductive layer pattern as a third ion implantation mask to form a low concentration impurity region having the second conductivity type in the second body region.

12. The method of claim 10, wherein forming the gate structure comprises:
    patterning the conductive layer pattern to form a gate electrode; and forming a gate spacer on side surfaces of the gate electrode.

13. The method of claim 8, wherein the first body region has an impurity concentration higher than the protruding portion of the second body region.

14. The method of claim 8, further comprising forming a buried layer in the substrate,
   wherein the buried layer has the second conductivity type, and the well region is disposed on the buried layer.

15. The method of claim 14, wherein the buried layer has an impurity concentration higher than the well region.

16. The method of claim 8, further comprising forming a field plate made of an insulating material in the well region,
   wherein the field plate is disposed between the protruding portion of the second body region and the drain region, and a portion of the gate structure is disposed on a portion of the field plate.

17. The method of claim 8, further comprising forming a body contact region in the second body region.

\* \* \* \* \*